(12) United States Patent
Sung et al.

(10) Patent No.: US 10,411,215 B2
(45) Date of Patent: Sep. 10, 2019

(54) ORGANIC LIGHT-EMITTING DISPLAY DEVICE AND METHOD FOR MANUFACTURING SAME

(71) Applicant: LG Display Co., Ltd., Seoul (KR)

(72) Inventors: BongKyu Sung, Daejeon (KR); Huiseong Yu, Jeonju-si (KR)

(73) Assignee: LG DISPLAY CO., LTD., Seoul (KR)

(*) Notice: Subject to any disclaimer, the term of this patent is extended or adjusted under 35 U.S.C. 154(b) by 33 days.

(21) Appl. No.: 15/798,176

(22) Filed: Oct. 30, 2017

(65) Prior Publication Data

US 2018/0123075 A1 May 3, 2018

(30) Foreign Application Priority Data

Oct. 31, 2016 (KR) .................. 10-2016-0143609

(51) Int. Cl.
| | |
|---|---|
| *H01L 51/52* | (2006.01) |
| *G09G 3/3233* | (2016.01) |
| *H01L 21/02* | (2006.01) |
| *H01L 27/32* | (2006.01) |
| *H01L 51/10* | (2006.01) |

(52) U.S. Cl.
CPC ....... *H01L 51/5203* (2013.01); *G09G 3/3233* (2013.01); *H01L 21/0217* (2013.01); *H01L 27/3276* (2013.01); *H01L 51/107* (2013.01); *H01L 51/5253* (2013.01); *G09G 2310/0264* (2013.01)

(58) Field of Classification Search
CPC .. H01M 2/166; H01M 2/1686; H01M 2/1653; H01L 51/5253; H01L 27/3244; H01L 51/5203; H01L 21/0217; H01L 51/5012; G09G 3/3233; G09G 3/22; G09G 2300/08; G09G 2320/045
See application file for complete search history.

(56) References Cited

U.S. PATENT DOCUMENTS

| | | | | |
|---|---|---|---|---|
| 2005/0179379 A1* | 8/2005 | Kim | ................ | H05B 33/04 313/512 |
| 2006/0049393 A1* | 3/2006 | Ichihara | ................ | H01J 1/3042 257/10 |
| 2006/0113907 A1* | 6/2006 | Im | ................ | H01L 51/5275 313/512 |
| 2010/0187986 A1* | 7/2010 | Kajitani | ................ | H01L 51/524 313/504 |
| 2013/0280583 A1* | 10/2013 | Lee | ................ | H01M 2/1686 429/144 |
| 2014/0008627 A1* | 1/2014 | Hiraoka | ................ | H01L 51/56 257/40 |
| 2014/0042415 A1* | 2/2014 | Park | ................ | H01L 51/5275 257/40 |

(Continued)

*Primary Examiner* — Sanjiv D. Patel
(74) *Attorney, Agent, or Firm* — Seed IP Law Group LLP

(57) ABSTRACT

The present disclosure provides an organic light-emitting display device including: a substrate; a first electrode configured to be disposed on the substrate; an organic layer configured to be disposed on the first electrode; a second electrode configured to be disposed on the organic layer; an anti-peeling layer configured to be disposed on the second electrode and to include an inorganic material; and a protective layer configured to be disposed on the anti-peeling layer and to include a metal oxide, and a method for manufacturing the organic light-emitting display device.

14 Claims, 14 Drawing Sheets

(56) References Cited

U.S. PATENT DOCUMENTS

2015/0090992 A1* 4/2015 Miyazawa .......... H01L 51/5271
　　　　　　　　　　　　　　　　　　　　　257/40
2015/0270482 A1* 9/2015 Lee .................... H01L 45/1675
　　　　　　　　　　　　　　　　　　　　　711/146

* cited by examiner

ORGANIC LIGHT-EMITTING DISPLAY DEVICE AND METHOD FOR MANUFACTURING SAME

CROSS REFERENCE TO RELATED APPLICATION

This application claims priority from Korean Patent Application No. 10-2016-0143609, filed Oct. 31, 2016, which is hereby incorporated by reference for all purposes as if fully set forth herein.

BACKGROUND

Technical Field

The present disclosure relates to an organic light-emitting display device for displaying an image and a method for manufacturing the same.

Description of the Prior Art

In recent years, an organic light-emitting display device, which has received great attention as a (next-generation) display device, has advantages of a high response speed, high light emission efficiency, high luminance, a wide viewing angle, and the like owing to the use of an Organic Light-Emitting Diode (OLED).

The OLED is very vulnerable to external gases such as oxygen and moisture. Accordingly, a protective layer for protecting the OLED is disposed to prevent the penetration of oxygen or moisture from the outside.

However, the material of the protective layer and the manufacturing process thereof greatly affect the quality of a product. It is necessary that the material of the protective layer and the manufacturing process thereof do not affect or decrease the quality of the product.

BRIEF SUMMARY

Against this background, an aspect of the present disclosure is to provide an organic light-emitting display device, which can prevent an Organic Light-Emitting Diode (OLED) from being damaged or prevent a protective layer or a second electrode from peeling off, regardless of the material of the protective layer and the manufacturing process thereof, thereby significantly improving the quality of the product.

In accordance with an aspect of the present disclosure, there is provided an organic light-emitting display device including: a substrate; a first electrode configured to be disposed on the substrate; an organic layer configured to be disposed on the first electrode; a second electrode configured to be disposed on the organic layer; an anti-peeling layer configured to be disposed on the second electrode and to include an inorganic material; and a protective layer configured to be disposed on the anti-peeling layer and to include a metal oxide.

In accordance with another aspect of the present disclosure, there is provided a method for manufacturing an organic light-emitting display device, including: forming a first electrode on a substrate; forming an organic layer on the first electrode; forming a second electrode on the organic layer; forming an anti-peeling layer with an inorganic film on the second electrode; and forming a protective layer with a metal oxide film on the anti-peeling layer.

As described above, according to the present disclosure, an organic light-emitting display device can prevent an OLED from being damaged or prevent a protective layer or a second electrode from peeling off, regardless of the material of the protective layer and the manufacturing process, thereby significantly improving the quality of the product.

BRIEF DESCRIPTION OF THE SEVERAL VIEWS OF THE DRAWINGS

The above and other objects, features and advantages of the present disclosure will be more apparent from the following detailed description taken in conjunction with the accompanying drawings, in which.

DETAILED DESCRIPTION

Figure 1:
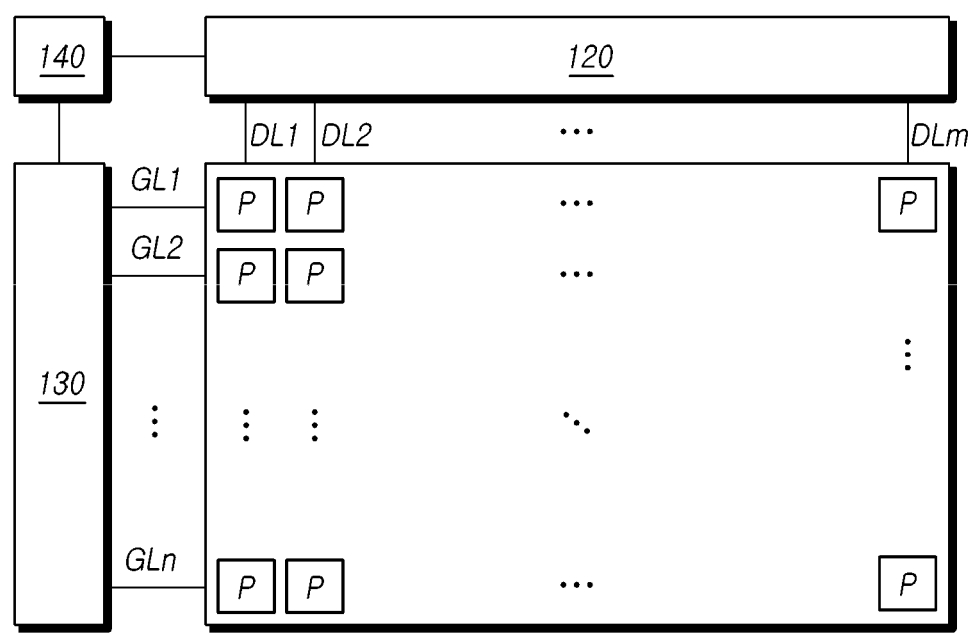
FIG. 1 is a schematic system configuration diagram of an organic light-emitting display device to which embodiments are applied.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a schematic system configuration diagram of an organic light-emitting display device to which embodiments are applied.

Referring to FIG. 1, an organic light-emitting display device 100 to which embodiments are applied includes a display panel 110, a data-driving unit 120, a gate-driving unit 130, a controller 140, and the like.

In the display panel 110, m data lines DL1 to DLm are arranged in a first direction and n gate lines GL1 to GLn are arranged in a second direction, which is different from the first direction, and a plurality of pixels P arranged in a pixel region where the formed m data lines DL1 to DLm and n gate lines GL1 to GLn cross each other is defined.

The data-driving unit 120 supplies a data voltage to the m data lines DL1 to DLm.

The gate-driving unit 130 sequentially supplies a scan signal to the n gate lines GL1 to GLn.

An Organic Light-Emitting Diode (OLED), a transistor, a capacitor, or the like may be formed in each pixel region of the display panel 110.

For example, in each pixel region, an OLED including a first electrode, an organic layer, and a second electrode, a driving transistor for supplying a current to the first electrode (e.g., an anode or a cathode) of the OLED, a storage capacitor for maintaining a data voltage transmitted to a gate node of the driving transistor for an amount of time corresponding to one frame, and the like are basically arranged.

The current is supplied to the first electrode of the OLED formed in each of the above-described pixel regions to emit light of a corresponding color in the organic layer. However, the OLED is very vulnerable to external gases such as oxygen and moisture. Accordingly, a protective layer for protecting the OLED is disposed to prevent the penetration of oxygen or moisture from outside.

However, depending on the material of the protective layer and the manufacturing process thereof, the OLED may be damaged, or the protective layer or the second electrode may be peeled, which may significantly degrade the quality of a product.

Hereinafter, an organic light-emitting display device according to embodiments and a method for manufacturing the same will be described in detail with reference to the drawings.

Figure 2:
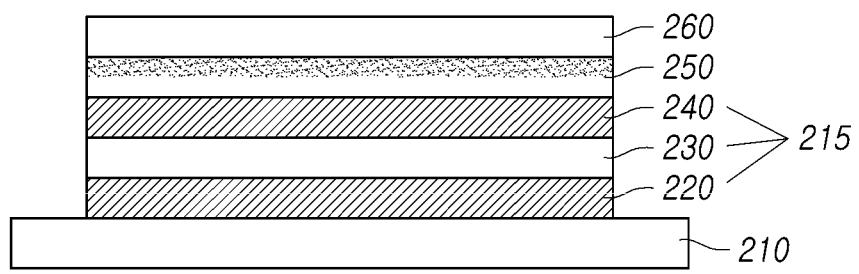
FIG. 2 is a cross-sectional diagram of an organic light-emitting display device according to an embodiment of the present disclosure.

FIG. 2 is a cross-sectional diagram of an organic light-emitting display device according to an embodiment of the present disclosure.

Referring to FIG. 2, an organic light-emitting display device 200 according to an embodiment may include a first electrode 220 disposed on a substrate 210, an organic layer 230 disposed on the first electrode 220, a second electrode 240 disposed on the organic layer 230, an anti-peeling layer 250 disposed on the second electrode 240, and a protective layer 260 disposed on the anti-peeling layer 250.

The organic light-emitting display device 200 according to an embodiment may be a bottom organic light-emitting display device that emits light in the direction of the substrate 210 or a top organic light-emitting display device that emits light in the direction opposite the substrate 210, that is, in the direction of the protective layer 260.

The first electrode 220 may be a transparent electrode or a metal electrode. When the first electrode 220 is the transparent electrode, the first electrode 220 may be made of a metal oxide such as ITO, TO, IZO, ZnO, ITZO, or $In_2O_3$. When the first electrode 220 is the metal electrode, the first electrode 220 may be made of a metal such as Ag, Mg, Al, Pt, Pd, Au, Ni, Nd, Ir, Cr, or an alloy thereof.

A light-emitting layer is provided in the organic layer 230 between the first electrode 220 and the second electrode 240. The light-emitting layer may include a red light-emitting layer, a green light-emitting layer, and a blue light-emitting layer, or may include a white light-emitting layer. In addition, the light-emitting layer may separately include red, green, and blue color filters.

At least one or more of a hole injection layer, a hole transport layer, an electron transport layer, an electron injection layer, and a capping layer, in addition to the light-emitting layer, may be further provided in the organic layer 230. The organic layer 230 may be made of a low-molecular organic material or a high-molecular organic material.

The second electrode 240 may also be a transparent electrode or a metal electrode. When the second electrode 240 is a transparent electrode, the second electrode 240 may be made of a metal oxide such as ITO, TO, IZO, ZnO, ITZO, or $In_2O_3$. When the second electrode 240 is a metal electrode, the second electrode 240 may be made of a metal such as Ag, Mg, Al, Pt, Pd, Au, Ni, Nd, Ir, Cr, or an alloy thereof. Hereinafter, the second electrode 240 is described as a metal electrode that is made of metal, but is not limited thereto.

The anti-peeling layer 250 may surround a side surface of an OLED 215 positioned on the substrate 210 together with an upper surface of the second electrode 240.

The anti-peeling layer 250 disposed on the second electrode 240 of the OLED 215 prevents the protective layer 260 or the second electrode from being peeled off by the process of manufacturing the protective layer 260, or prevents a dark spot from being generated when the device is turned on, thereby protecting the OLED 215. As will be described later, the anti-peeling layer 250, which is not affected by an oxygen ($O_2$) gas that is used during the manufacturing process of the protective layer 260, is disposed below the protective layer 260 between the second electrode 240 and the protective layer 260, thereby protecting the OLED 215 and preventing the protective layer 260 or the second electrode from peeling off.

In terms of materials, the anti-peeling layer 250 may contain an inorganic material. The inorganic material contained in the anti-peeling layer 250 may be an inorganic material that does not contain oxygen. At this time, the anti-peeling layer 250 may be made of an inorganic material that does not contain oxygen using Plasma Enhanced Chemical Vapor Deposition (PECVD). The anti-peeling layer 250 may be made of an inorganic material that does not contain oxygen, for example, a material selected from silicon nitride, aluminum nitride, zirconium nitride, titanium nitride, hafnium nitride, and the like, but the material of the anti-peeling layer 250 is not necessarily limited to the above examples. Specifically, the inorganic material that does not contain oxygen may be $SiN_y$ (where y is a real number larger than 1).

When the second electrode 240 is a metal electrode, an inorganic material contained in the anti-peeling layer 250 disposed on the second electrode 240 may be a metal nitride for a metal contained in the second electrode 240. For example, when the second electrode 240 is aluminum, the anti-peeling layer 250 may be made of aluminum nitride. When the metal nitride for the metal contained in the second electrode 240 is formed on the second electrode 240 through a nitrogen ($N_2$) plasma treatment, it is possible to prevent the OLED 215 from being damaged without separate additional equipment.

The protective layer 260 is disposed to protect the OLED 215. The protective layer 260 may surround the side surfaces of the OLED 215 and the anti-peeling layer 250, which are positioned above the substrate 210 together with the upper surface of the anti-peeling layer 250.

The protective layer 260 may prevent the penetration of oxygen or moisture into the OLED 215. The protective layer 260 disposed on the anti-peeling layer 250 may contain a metal oxide.

The protective layer 260 may be made of a metal oxide, for example, a material selected from calcium oxide, alumina, silica, titania, indium oxide, tin oxide, and silicon oxide, but the material of the protective layer 260 is not necessarily limited to the above examples.

Specifically, the metal oxide may be a silicon oxide (SiOx) (where x is a real number larger than 1). When the protective layer 260 contains a silicon oxide as described below, the protective layer 260 may be made of a silicon oxide (SiOx) using hexamethyldisiloxane (HMDSO), represented by Chemical Formula 1, and oxygen in a plasma atmosphere.

[Chemical Formula 1]

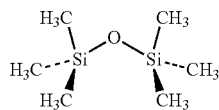

Figure 3:
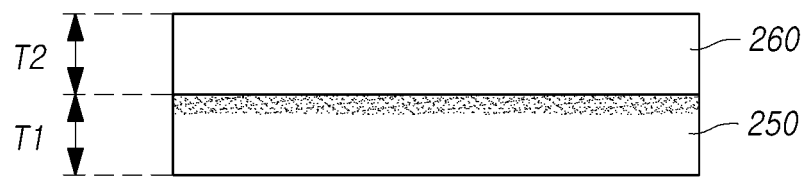
FIG. 3 is an enlarged view of an anti-peeling layer and a protective layer of FIG. 2.

FIG. 3 is an enlarged view of the anti-peeling layer 250 and the protective layer 260 of FIG. 2.

Referring to FIG. 3, the thickness T1 of the anti-peeling layer 250 and the thickness T2 of the protective layer 260 may be different from each other. For example, the thickness T2 of the protective layer 260 may be greater than the thickness T1 of the anti-peeling layer 250. As an example, the thickness T1 of the anti-peeling layer 250 may range from 0.1 um to 0.5 um, but is not limited thereto.

As will be described later, in a step of forming the protective layer 260, when the protective layer 260 is made of the silicon oxide (SiOx) (where x is a real number larger than 1) using hexamethyldisiloxane and oxygen ($O_2$) through PECVD, the molecular structure, physicochemical properties, and film quality of the silicon oxide (SiOx) (where x is a real number larger than 1) are different from those of the silicon oxide (SiOx) (where x is a real number larger than 1) generally using $SiH_4$ and oxygen ($O_2$). In addition, when the protective layer 260 is made of silicon oxide (SiOx), hydrogen does not remain during the formation of the protective layer 260, thereby preventing such residual hydrogen from causing highly luminescent spot defects.

FIGS. 4A to 4E are process diagrams of a method for manufacturing an organic light-emitting display device according to another embodiment.

Figure 4A:
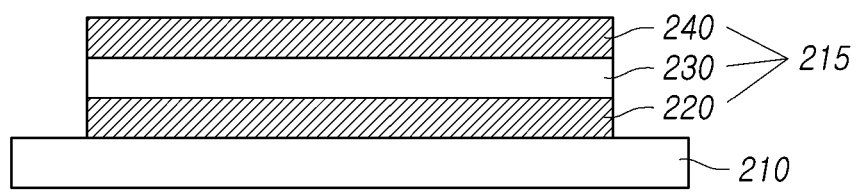
FIGS. 4A to 4E are process diagrams of a method for manufacturing an organic light-emitting display device according to another embodiment.

Referring to FIG. 4A, a method for manufacturing an organic light-emitting display device according to another embodiment includes forming the OLED 215 on the substrate 210.

In the forming the OLED 215 on the substrate 210, the OLED 215 including the first electrode 220, the second electrode 240 corresponding to the first electrode 220, and the organic layer 230 disposed between the first electrode 220 and the second electrode 240 may be formed on one surface of the substrate 210 for each unit pixel.

Figure 4B:
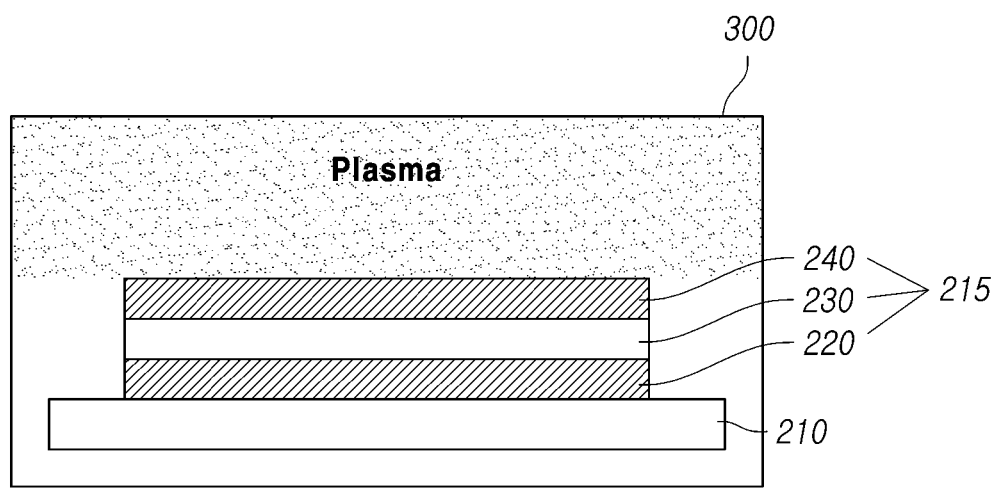
Figure 4C:
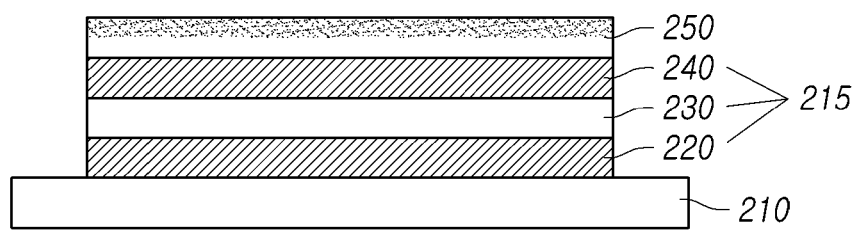

Referring to FIGS. 4B and 4C, the method for manufacturing the organic light-emitting display device according to another embodiment includes forming the anti-peeling layer 250 on the OLED 215. The substrate 210, with the various layers thereon maybe placed in a manufacturing apparatus 300 a various times during the manufacturing process.

In the formation of the anti-peeling layer 250 on the second electrode 240 of the OLED 215, the anti-peeling layer 250 may be made of an inorganic material that does not contain oxygen, for example, a material selected from silicon nitride, aluminum nitride, zirconium nitride, titanium nitride, hafnium nitride, and the like. Specifically, the inorganic material that does not contain oxygen may be SiNy (where y is a real number larger than 1).

In the formation of the anti-peeling layer 250 on the second electrode 240, in the case in which the second electrode 240 is made of a metal, when the metal contained in the second electrode 240 is metal nitride, for example, aluminum, the anti-peeling layer 250 may be made of aluminum nitride.

In the formation of the anti-peeling layer 250 on the second electrode 240, in the case in which the second electrode 240 is made of a metal, when the metal nitride for the metal contained in the second electrode 240 is formed on the second electrode 240 through a nitrogen ($N_2$) plasma treatment, it is possible to form chemically stable metal nitride and to form the anti-peeling layer 250 without separate additional equipment. For example, the anti-peeling layer 250 made of the metal nitride may be formed by the second electrode 240 through nitrogen ($N_2$) plasma treatment on aluminum (Al).

Figure 4D:
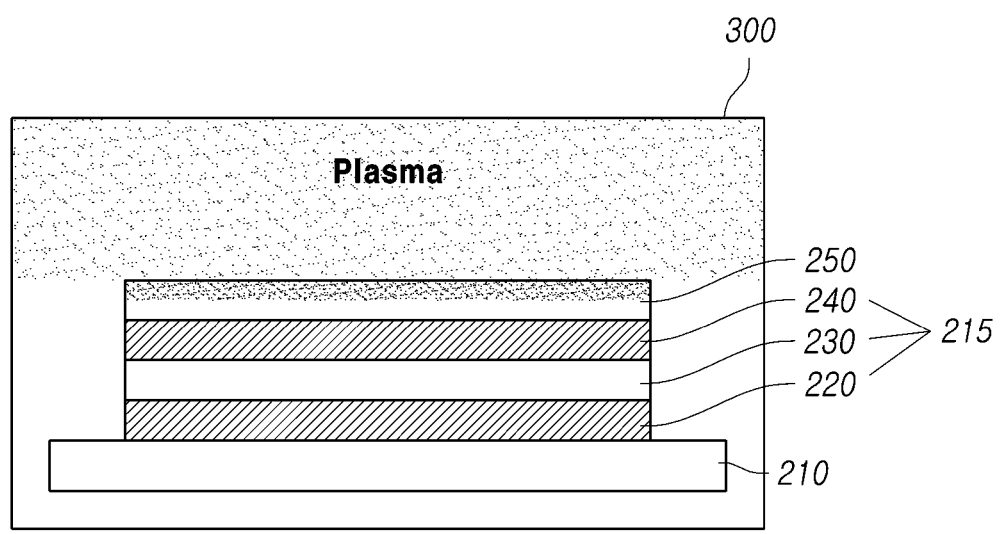
Figure 4E:
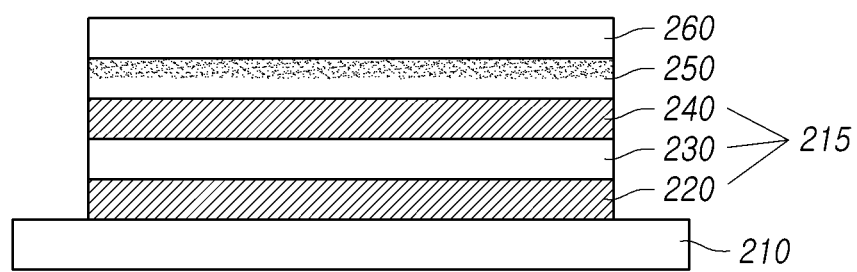

Referring to FIGS. 4D and 4E, the method for manufacturing the organic light-emitting display device according to another embodiment includes forming the protective layer 260 with a metal oxide film on the anti-peeling layer 250.

In the formation of the protective layer 260, the protective layer 270 may be made of a metal oxide, for example, a material selected from calcium oxide, alumina, silica, titania, indium oxide, tin oxide, and silicon oxide. Specifically, the metal oxide may be a silicon oxide (SiOx) (where x is a real number larger than 1). When the protective layer 260 contains a silicon oxide, the protective layer 260 may be made of a silicon oxide (SiOx) using hexamethyldisiloxane (HMDSO) and oxygen in a plasma atmosphere. When the protective layer 260 is made of the silicon oxide (SiOx), hydrogen does not remain during the formation of the protective layer 260, thereby preventing such residual hydrogen from causing highly luminescent spot defects.

In order to form the protective layer 260 using the silicon oxide (SiOx) through Metalorganic Chemical Vapor Deposition (MOCVD), an oxygen ($O_2$) gas in a plasma state which reacts with hexamethyldisiloxane in the manufacturing apparatus 300 is used. However, when the specific gravity of the oxygen ($O_2$) gas is low, it is difficult to prevent moisture permeation due to poor metal oxide film quality, and when the specific gravity of the oxygen ($O_2$) gas is high, the protective layer 260 or the second electrode may be peeled off, or a dark spot may be generated when the device is turned on.

However, the anti-peeling layer 250 which is not affected by the oxygen ($O_2$) gas is formed below the protective layer 260 between the second electrode 240 and the protective layer 260 using MOCVD, thereby protecting the OLED 215 and preventing the protective layer 260 or the second electrode from peeling off, regardless of the material of the protective layer and the manufacturing process thereof.

Figure 5:
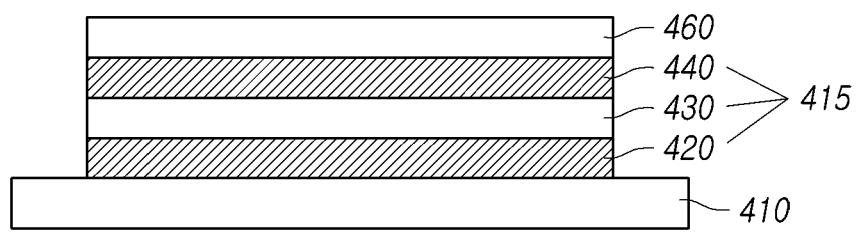
FIG. 5 is a cross-sectional view of an organic light-emitting display device according to a comparative example.

FIG. 5 is a cross-sectional view of an organic light-emitting display device according to a comparative example.

Referring to FIG. 5, an organic light-emitting display device 400 according to an embodiment includes an OLED 415 disposed on a substrate 410 and a protective layer 460 disposed on the OLED 415.

The OLED 415 formed on one surface of the substrate 410 for each unit pixel may include a first electrode 420 that is formed on an active region for each unit pixel and is supplied with a current from a corresponding driving transistor, a second electrode 440 corresponding to the first electrode 420, and an organic layer 430 disposed between the first electrode 420 and the second electrode 440.

The protective layer 460 containing a metal oxide is disposed to protect the OLED 415. The protective layer 460 is made of a metal oxide, for example, a material selected from calcium oxide, alumina, silica, titania, indium oxide, tin oxide, and silicon oxide.

Figure 6A:
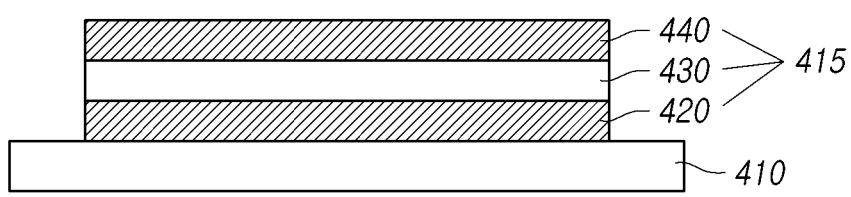
FIGS. 6A to 6C are process diagrams of a method for manufacturing an organic light-emitting display device according to a comparative example.
Figure 6B:
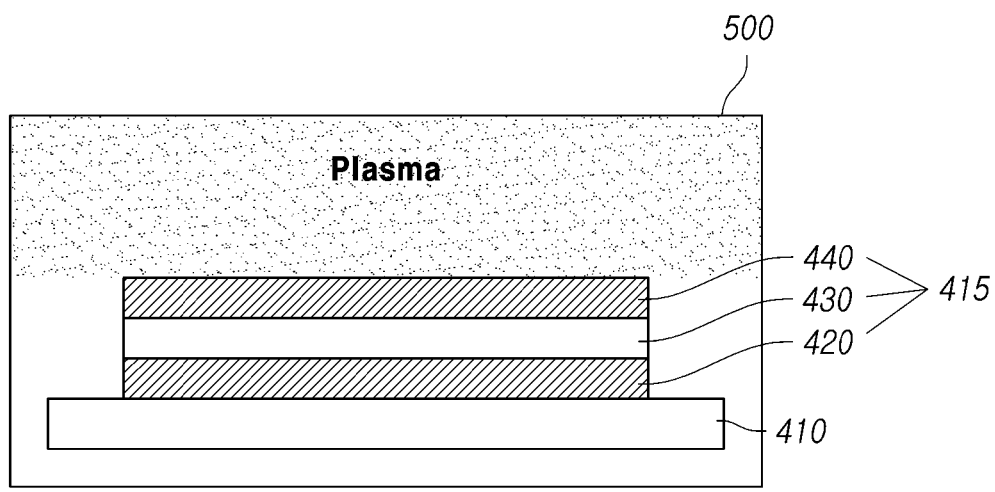
Figure 6C:
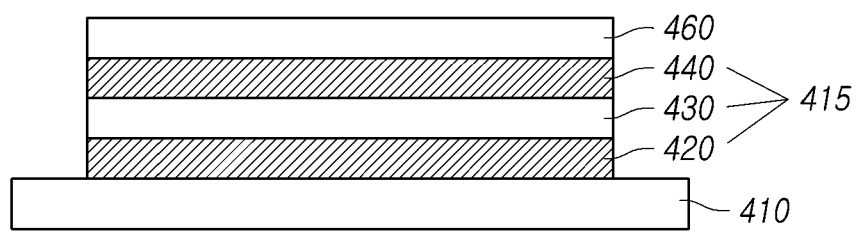

FIGS. 6A to 6C are process diagrams of a method for manufacturing an organic light-emitting display device according to a comparative example.

Referring to FIG. 6A, the method for manufacturing the organic light-emitting display device according to a comparative example includes forming the OLED 415 on the substrate 410.

In the formation of the OLED 415 on the substrate 410, the OLED 415 including the first electrode 420, the second electrode 440 corresponding to the first electrode 420, and the organic layer 430 disposed between the first electrode 420 and the second electrode 440 may be formed on one surface of the substrate 410 for each unit pixel.

Referring to FIGS. 6B and 6C, the method for manufacturing the organic light-emitting display device according to a comparative example includes forming the protective layer 460 with a metal oxide film on the second electrode 440.

In the formation of the protective layer 460, the protective layer 460 may be formed using a metal oxide, for example, a silicon oxide (SiOx) (where x is a real number larger than 1). For example, the protective layer 460 may be made of silicon oxide (SiOx) using hexamethyldisiloxane and oxygen in a plasma atmosphere through MOCVD.

Figure 7:
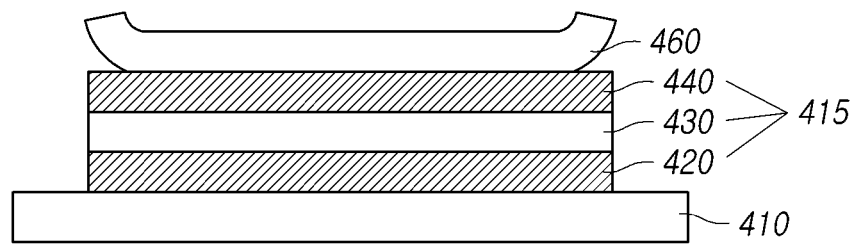
FIG. 7 illustrates a phenomenon in which a side surface of a protective layer is peeled off in an organic light-emitting display device according to a comparative example.

Referring to FIG. 6B, in order to form the protective layer 460 using the silicon oxide (SiOx) through MOCVD, an oxygen ($O_2$) gas in a plasma state which reacts with hexamethyldisiloxane in a manufacturing apparatus 500 is used. However, when the specific gravity of the oxygen ($O_2$) gas is low, the silicon oxide itself is not generated and it is difficult to prevent moisture permeation due to poor metal oxide film quality. When the specific gravity of the oxygen ($O_2$) gas is high, a light-emitting layer including an organic material may be damaged due to oxygen ion bombardment and the high oxidizing power of plasma itself when the plasma is generated, so that a dark spot may be generated when the device is turned on, or the protective layer 460 or the second electrode may be peeled off. FIG. 7 illustrates a phenomenon in which a side surface of the protective layer 460 is peeled off in an organic light-emitting display device according to a comparative example.

Figure 8:
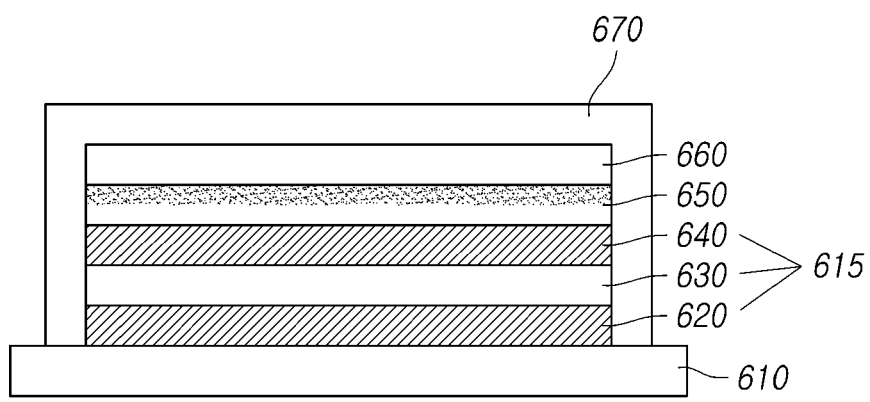
FIG. 8 is a cross-sectional view of an organic light-emitting display device according to still another embodiment.

FIG. 8 is a cross-sectional view of an organic light-emitting display device according to still another embodiment.

Referring to FIG. 8, an organic light-emitting display device 600 according to still another embodiment may include an OLED 615 disposed on a substrate 610, an anti-peeling layer 650 disposed on the OLED 615, and a protective layer 660 disposed on the anti-peeling layer 650.

A light-emitting layer is provided in an organic layer 630 between a first electrode 620 and a second electrode 640. At least one or more of a hole injection layer, a hole transport layer, an electron transport layer, and an electron injection layer, in addition to the light-emitting layer, may be further provided in the organic layer 630. The organic layer 630 may be made of a low-molecular-weight organic material or a high-molecular-weight organic material.

However, the anti-peeling layer 650 which is not affected by an oxygen ($O_2$) gas is formed below the protective layer 660 between the second electrode 640 and the protective layer 660 using MOCVD, thereby protecting the OLED 615 and preventing the protective layer 660 or the second electrode from peeling off.

The organic light-emitting display device 600 according to still another embodiment may include an encapsulation layer 670 disposed on the protective layer 660. The encapsulation layer 670 may surround side surfaces of the OLED 615, the anti-peeling layer 650, and the protective layer 660, which are positioned on the substrate 610, together with an upper surface of the protective layer 660.

The encapsulation layer 670 may be made of a resin and may include at least one selected from, for example, an epoxy resin, a phenol resin, an amino resin, a silicone resin, an acryl resin, a vinyl resin, and an olefin resin.

In the manufacturing process, as described with reference to FIGS. 4A to 4E, the OLED 615, the anti-peeling layer 650, and the protective layer 660 may be sequentially formed on the substrate 610, and then the encapsulation layer 670 may be formed on the protective layer 660 using a resin.

The encapsulation layer 670 may additionally prevent the penetration of oxygen or moisture from the outside, thereby protecting the OLED 615 and significantly improving the quality of the product.

The organic light-emitting display device according to the above-described embodiments may prevent the OLED from being damaged or prevent the protective layer or the second electrode from peeling off, regardless of the material of the protective layer and the manufacturing process thereof, thereby significantly improving the quality of the product.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device, comprising:
    a substrate;
    a first electrode disposed on the substrate;
    an organic layer disposed on the first electrode;
    a second electrode disposed on the organic layer, the second electrode includes a metal;
    an anti-peeling layer disposed on the second electrode, the anti-peeling layer including an inorganic material, the inorganic material is a metal nitride of the metal included in the second electrode; and
    a protective layer disposed on the anti-peeling layer, the protective layer including a metal oxide.

2. The organic light-emitting display device of claim 1, wherein the inorganic material included in the anti-peeling layer is an inorganic material that does not include oxygen.

3. An organic light-emitting display device, comprising:
    a substrate;
    a first electrode disposed on the substrate;
    an organic layer disposed on the first electrode;
    a second electrode disposed on the organic layer, the second electrode includes a metal;
    an anti-peeling layer disposed on the second electrode, the anti-peeling layer including an inorganic material,
    wherein the metal of the second electrode includes aluminum, and the anti-peeling layer includes aluminum nitride.

4. The organic light-emitting display device of claim 1, wherein the metal oxide of the protective layer includes a silicon oxide.

5. The organic light-emitting display device of claim 1, wherein a thickness of the protective layer is greater than a thickness of the anti-peeling layer.

6. The organic light-emitting display device of claim 1, further comprising:
    an encapsulation layer disposed on the protective layer.

7. A method for manufacturing an organic light-emitting display device, comprising:
    forming a first electrode on a substrate;
    forming an organic layer on the first electrode;
    forming a second electrode on the organic layer, wherein the second electrode includes a metal;
    forming an anti-peeling layer that includes an inorganic film on the second electrode; and
    forming a protective layer that includes a metal oxide film on the anti-peeling layer, the anti-peeling layer includes a metal nitride of the metal of the second electrode.

8. A method for manufacturing an organic light-emitting display device, comprising:
    forming a first electrode on a substrate;
    forming an organic layer on the first electrode;
    forming a second electrode on the organic layer, the second electrode includes aluminum;
    forming an anti-peeling layer that includes an inorganic film on the second electrode; and
    forming a protective layer that includes a metal oxide film on the anti-peeling layer,
    wherein the anti-peeling layer is made of metal nitride through nitrogen plasma treatment on aluminum.

9. The method for manufacturing an organic light-emitting display device of claim 8, wherein, in the forming the anti-peeling layer, the anti-peeling layer is made of an inorganic material through Plasma Enhanced Chemical Vapor Deposition (PECVD), and in the forming the protective layer, the protective layer is made of a silicon oxide using hexamethyldisiloxane and oxygen through Metalorganic Chemical Vapor Deposition (MOCVD).

10. The organic light-emitting display device of claim 3, wherein the inorganic material included in the anti-peeling layer is an inorganic material that does not include oxygen.

11. The organic light-emitting display device of claim 3, further comprising:
    a protective layer disposed on the anti-peeling layer, the protective layer including a metal oxide, wherein the metal oxide of the protective layer includes a silicon oxide.

12. The organic light-emitting display device of claim 3, further comprising:
    a protective layer disposed on the anti-peeling layer, wherein a thickness of the protective layer is greater than a thickness of the anti-peeling layer.

13. The organic light-emitting display device of claim 3, further comprising:
    a protective layer disposed on the anti-peeling layer, the protective layer including a metal oxide; and
    an encapsulation layer disposed on the protective layer.

14. The method for manufacturing an organic light-emitting display device of claim 7, wherein, in the forming the anti-peeling layer, the anti-peeling layer is made of an inorganic material through PECVD, and in the forming the protective layer, the protective layer is made of a silicon oxide using hexamethyldisiloxane and oxygen through MOCVD.

* * * * *